United States Patent
Birkle et al.

(10) Patent No.: US 7,026,728 B2
(45) Date of Patent: Apr. 11, 2006

(54) SYSTEM FOR SUPPLYING ELECTRICAL POWER TO A LOAD BY A TRANSMISSION PATH WHICH HAS BEEN SPLIT INTO TWO PARTS

(75) Inventors: Siegfried Birkle, Höchstadt (DE); Stefan Hain, Effeltrich (DE)

(73) Assignee: Siemens Aktiengesellschaft, Munich (DE)

( * ) Notice: Subject to any disclaimer, the term of this patent is extended or adjusted under 35 U.S.C. 154(b) by 158 days.

(21) Appl. No.: 10/478,187

(22) PCT Filed: Mar. 14, 2003

(86) PCT No.: PCT/DE03/00837

§ 371 (c)(1),
(2), (4) Date: Mar. 15, 2004

(87) PCT Pub. No.: WO03/081746

PCT Pub. Date: Oct. 2, 2003

(65) Prior Publication Data

US 2004/0160217 A1    Aug. 19, 2004

(30) Foreign Application Priority Data

Mar. 27, 2002  (DE) .................... 102 13 845

(51) Int. Cl.
  *H02M 1/12*   (2006.01)
  *H01H 33/59*  (2006.01)
(52) U.S. Cl. .................. 307/105; 307/140; 361/63; 340/424
(58) Field of Classification Search ............... 307/140, 307/104, 105; 361/63, 42; 340/870, 39, 340/424, 536, 647, 472; 324/424, 656
See application file for complete search history.

(56) References Cited

U.S. PATENT DOCUMENTS

| | | | | |
|---|---|---|---|---|
| 3,702,460 A | * | 11/1972 | Blose | .......... 340/3.1 |
| 4,433,326 A | * | 2/1984 | Howell | .......... 307/3 |
| 4,492,919 A | | 1/1985 | Milkovic | |
| 4,866,436 A | | 9/1989 | Kordts et al. | |
| 5,519,561 A | * | 5/1996 | Mrenna et al. | .......... 361/105 |
| 5,568,042 A | | 10/1996 | Nyberg et al. | |
| 6,411,865 B1 | * | 6/2002 | Qin et al. | .......... 700/286 |

FOREIGN PATENT DOCUMENTS

| | | |
|---|---|---|
| DE | 910 925 | 5/1954 |
| DE | 24 28 906 | 1/1976 |
| DE | 25 46 694 | 4/1976 |
| DE | 25 32 212 | 1/1977 |

(Continued)

OTHER PUBLICATIONS

Gross, "Optical Power Supply for Fiber-optic Hybrid Sensors", Sensors and Actuators A. 25-27 (1991) pp. 475-480, no date.

(Continued)

*Primary Examiner*—Rajnikant B. Patel
(74) *Attorney, Agent, or Firm*—Staas & Halsey LLP (57) ABSTRACT

The system is intended to provide an isolated power supply for an electrical load. It contains a generator for producing a supply signal, and a transmission path having two separate branch elements. The first branch element is designed for transmission of the supply signal (S1) in the forward direction, and the second branch element is designed for transmission of the supply signal in the backward direction, so that this results in a closed circuit for the supply signal. The two branch elements contain means for isolation. The load can be supplied by the supply signal with an electrical power of at most 100 mW.

21 Claims, 4 Drawing Sheets

FOREIGN PATENT DOCUMENTS

| | | |
|---|---|---|
| DE | 29 11 476 | 9/1980 |
| DE | 36 43 715 A1 | 6/1988 |
| DE | 37 42 610 C1 | 9/1989 |
| DE | 44 42 677 A1 | 6/1996 |
| DE | 694 14 803 T2 | 7/1999 |
| DE | 198 41 164 | 3/2000 |
| DE | 199 05 118 A1 | 8/2000 |
| EP | 0 398 723 | 11/1990 |
| WO | WO 99/42844 | 8/1999 |

OTHER PUBLICATIONS

Kimbark, Direct current Transmission, vol. 1, 1971, pp. 187-191, no date.

Küchler, Hochspannungstechnik 1996, VDI-Verlag, pp. 325-326, no date.

Richter, "Digital Strom- und Spannungsmeβeinrichtung mit groβer Bandreite auf Hochspannungspotential". Elektrie. Berlin 49 (1995) 1/2, no date.

Kuntz et al., "Energie- und Datenübertragung über Lichtwellenleiter bei intelligenten Sensoren", Technisches Messen tm 56 (Apr. 1989) pp. 164-170 (with English language abstract).

Stierlin, "Faseroptische Sensoren, Teil 2 Faseroptische Stromsensoren,", Bulletin SEV/VSE 82 (1991), no date.

* cited by examiner

SYSTEM FOR SUPPLYING ELECTRICAL POWER TO A LOAD BY A TRANSMISSION PATH WHICH HAS BEEN SPLIT INTO TWO PARTS

CROSS REFERENCE TO RELATED APPLICATIONS

This application is based on and hereby claims priority to PCT Application No. PCT/DE03/00837, filed on Mar. 14, 2003 and German Application No. 10213845.1 filed on Mar. 27, 2002, the contents of which are hereby incorporated by reference.

BACKGROUND OF THE INVENTION

One aspect of the invention relates to a system for providing an isolated supply of electrical power for an electrical load.

In general, an electrical load is supplied with electrical power in the form of a supply voltage or a supply current via a single electrical cable from a voltage source or current source.

Sometimes, an isolated (=DC isolated) power supply is required for the load, without any conductive connection between the load and the supply source. If the electrical load is arranged at an electrical potential which differs to a very major extent from that of the power source, or very stringent requirements with regard to electromagnetic compatibility (EMC) have to be satisfied, supply via a single electrical supply line is at least difficult. Examples of applications such as these are current measurement and voltage measurement in public power supply facilities, and ECG, breathing or pulse measurement on a patient during a magnetic resonance imaging investigation carried out in parallel.

A system is known in which light from a light source, for example from a laser diode or a light-emitting diode (LED), is transmitted to a photoelectric transducer, where it is converted into electrical energy, which is used to supply the load. In order to transmit light, the light source and the photoelectric transducer are optically connected to one another via an optical waveguide or else via a free-beam system. An isolated, optically operated supply system such as this for an electrical sensor is described, for example, in "Sensors and Actuators A" Volumes 25 to 27 (1991), pages 475 to 480. The light from a laser diode is transmitted via an optical waveguide to a photoelement array, which converts it to the electrical energy for the sensor. The measurement data from the sensor is likewise transmitted optically via an optical waveguide. However, owing to the special components that are used, in particular the high-power laser, the photoelement array and the optical plug connections, this supply system is associated with not inconsiderable complexity.

A system is also known, in which the electrical energy is obtained from the immediate area surrounding an electrical sensor that is to be supplied, for example inductively from a high-voltage network or photovoltaically from solar radiation. However, this system for supplying power is subject to the undesirable side effect that no electrical power is available when the high-voltage network is not operating, or when the sun is not shining. A system which draws its electrical power from the high-voltage network is described in DE 25 46 694 A1.

Another system for providing an isolated supply of electrical power for an electrical load is disclosed in DE 44 42 677 A1. In this case, a radio transmitter transmits energy in the form of radio waves to a radio receiver, which converts the radio waves to the electrical power for the electrical load. If the load is a sensor, then the measurement data from the sensor is also transmitted by radio. This system thus allows DC-isolated power and data transmission without any cables. Legal regulations relating to radio traffic restricts the capability to use this system, however.

A further known approach for an isolated power supply for a load which is, in particular, at a high-voltage potential is to supply radio-frequency electrical energy to a capacitor which is resistant to high voltages, or to a capacitive divider which may be present in any case for voltage measurement. The capacitor or the capacitive divider in this case bridges the potential difference. One disadvantage is that undefined impedance ratios may occur. This is because, while the capacitor or the capacitive divider is used as the forward line for the radio-frequency power, the return line is provided in a largely undefined manner via a conductor to ground capacitance of an existing high-voltage overhead line and/or via an adjacent item of equipment. In order nevertheless to ensure operability, a relatively high supply frequency, for example of >10 MHz, is required. However, the system then overall acts as a transmitting antenna, which on the one hand leads to an undesirable loss of energy due to radiated emissions, and on the other hand leads to conflicts with the already mentioned legal regulations relating to radio traffic.

A radio-frequency signal is also transmitted by capacitive components in the system disclosed in DE 910 925 for controlling the drive for gas and steam discharge paths. A first capacitive branch element is provided for the forward direction, and a second capacitive branch element for the backward direction. The radio-frequency signal is, however, not used for supplying power but, in fact, for controlling an initiation circuit which is associated with the high-voltage potential.

DE 29 11 476 A1 describes a further development of the transmission path disclosed in DE 910 925 for a system for supplying power to a load that is at a high-voltage potential. The transmission path is in this case in the form of a symmetrical filter chain formed by series capacitors and parallel inductors. The parallel inductors were expressly also included in the system in order to reduce the load on the radio-frequency generator from the provision of the wattless component, and in order to compensate for isolation differences occurring between adjacent capacitors. However, owing to the large number of individual components required, the system is complex to implement.

SUMMARY OF THE INVENTION

One possible object is supplying electrical power to an electrical load, which ensures that the power is supplied in as simple a manner as possible and, at the same time, does not lead to any conflicts with the legal regulations for radio traffic.

The system according to one aspect of the invention comprises at least:

a generator for producing a supply signal, a transmission path which contains two separate branch elements, with the first branch element being designed for transmission of the supply signal in the direction from the generator to the load, and the second branch element being designed for transmission of the supply signal in the direction from the load to the generator, two branch elements are each connected to the generator and to the load such that a closed circuit is formed for the supply signal, the two branch elements have an isolation unit and the load can be supplied by the supply signal with an electrical power of at most 100 mW.

One aspect of the invention is in this case based on the knowledge that defined impedance ratios in the forward direction and in the backward direction of the supply signal can be achieved on the basis of a transmission path which is provided by two separate branch elements. The supply circuit is then no longer closed via an undefined air gap, but via a branch element which is intended for use as the return line for the supply signal. The two branch elements are, in particular, formed such that they are completely isolated from one another, that is to say there is no electrically conductive connection between the two branch elements except at the location of the generator and of the load.

Owing to the defined impedance ratios as well as the low load power, the supply signal may in particular be at a relatively low supply frequency, for example of ≦1 MHz. The supply signal is transmitted in both branch elements by cables and, in particular, electrically. This largely suppresses radiated radio emissions from the supply signal, so that the legal regulations are not infringed by the radio traffic.

Owing to the low transmission losses—in particular, there is no undesirable radiated emission of supply power on the transmission path—and owing to the low load power, it is possible to use a supply signal generator which is designed for a relatively low power level and thus costs little.

Specifically, it has been found that the parallel inductors which are used in the system that is known from DE 29 11 476 A1 can be omitted without any significant adverse effects on operation. This is true even if the load is supplied via the supply signal with only a low power level, for example of at most 100 mW. The supply signal generator can itself apply the charging power level which may be required for the branch elements in this power range. Special precautions for this purpose are equally unnecessary as a special design of the generator. Overall, the omission of the parallel inductors and the low-power configuration of the generator result in a very simple and low-cost system for an isolated power supply for a load.

The system can be used particularly advantageously when there is a potential difference between the location of the load and that of the generator. In this case, the isolated power supply is particularly advantageous. In particular, the generator may be at ground potential and the load at a high potential, for example at a potential of several tens of kilovolts.

Furthermore, the two branch elements are preferably arranged closely adjacent to one another. This reduces the space required for the system. In addition, close physical proximity between the two branch elements prevents intrinsically undesirable radiated emission of supply energy. The two branch elements which are respectively intended for the forward direction and the backward direction have a similar effect to a bifilar conductor system, in which mutual compensation is provided for the radiated emission response. In particular, the two branch elements are accommodated alongside one another in an isolator, thus reducing the costs for voltage isolation between the two branch elements. It is at least possible to use a common isolator housing.

The transmission path of the system can preferably be used not only for supplying power but also for some other purpose, for example for voltage measurement. In this case, the system for supplying power can be integrated in some other equipment which is provided in any case, thus making it possible to further restrict the costs for the system. In particular, the transmission path may also be used for detection of the electrical voltage between the location of the load and ground.

In another refinement, the branch elements each contain at least one reactance as an isolation unit. In this case, it is particularly advantageous to use a capacitance, which can be used well for the desired isolation. In particular, each of the branch elements may also include a standardized or series-production component, for example in the form of a wound capacitor bank. This results in a particularly low-cost implementation. However, an inductance may also be used as the reactance.

It is advantageous for the supply signal to be at a supply frequency which is between about 1 kHz and about 1 MHz. Radiated emissions of supply energy can be suppressed well in this frequency range. Furthermore, the lower limit mentioned is far enough away from a mains system frequency that is used for public power supply facilities (DC, 50 Hz or 60 Hz), and is sufficiently far away from the harmonics of this mains system frequency which may be relevant for measurement and evaluation purposes, so that any influence can be precluded.

A system also exists which is operated with a supply signal in the form of a DC signal. This prevents radiated emissions in any case. Any potential difference in this system is preferably bridged by inductances provided in the branch elements.

The load which is supplied with electrical power may, for example, be a test set, in particular an ammeter. The transmission path may then be used not only for transmission of the supply signal but also, in particular, for electrical transmission of a measurement signal which is determined by the test set. A measurement signal frequency which is intended for this purpose is preferably not the same as the supply frequency, in order to avoid any influence. In principle, however, the same frequency range may be used for the measurement signal frequency as for the supply frequency. A cost saving can be achieved by integration of different functions in the transmission path.

In principle, it is also possible to transmit the measurement information determined by a load in the form of a test set via an additional transmission path. The transmission paths which are used for supply signal transmission and for measurement signal transmission are then designed to be isolated from one another. They may also use different transmission principles, for example electrical and/or optical transmission. This results in particularly good isolation between the supply signal and measurement signal.

BRIEF DESCRIPTION OF THE DRAWINGS

These and other objects and advantages of the present invention will become more apparent and more readily appreciated from the following description of the preferred embodiments, taken in conjunction with the accompanying drawings of which.

Mutually corresponding paths are provided with the same reference symbols in FIGS. 1 to 4.

DETAILED DESCRIPTION OF THE PREFERRED EMBODIMENT

Reference will now be made in detail to the preferred embodiments of the present invention, examples of which are illustrated in the accompanying drawings, wherein like reference numerals refer to like elements throughout.

Figure 1:
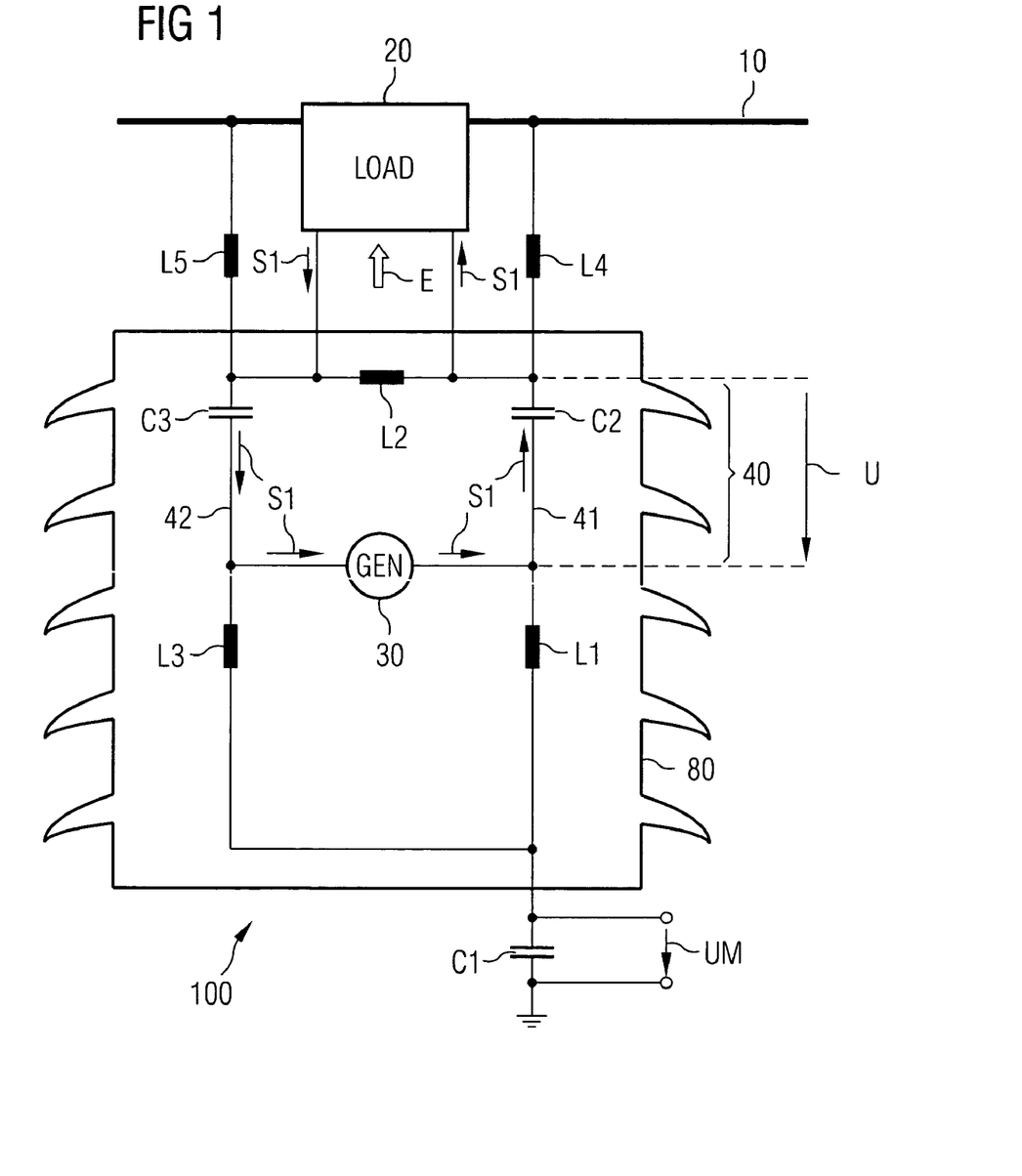
FIG. 1 shows a system, which is integrated in a capacitive voltage converter, for an isolated power supply.

FIG. 1 shows a system 100 for an isolated power supply for a load 20. The load 20 is arranged adjacent to a high-voltage conductor 10, and is thus at the high-voltage potential, that is to say at a potential of at least several tens of kilovolts.

Power E is supplied to the load 20 via a supply signal S1, which is transmitted by a transmission path 40. In order to ensure isolation, the transmission path 40 in the example shown in FIG. 1 contains two transmission capacitances C2 and C3, across each of which a potential difference $\Delta U$ is dropped, which forms the majority of the conductor-ground voltage of the high-voltage conductor 10.

The supply signal S1 is produced, for example at a frequency of 100 kHz, by a generator 30 which is effectively at ground potential. The supply signal S1 is fed into a first branch element 41, which includes the transmission capacitances C2, of the transmission path 40, and is transmitted to the load 20. The power E is drawn in a manner which is not illustrated but which is known per se from the supply signal S1 in the load 20, and is made available to the load 20 for operation of, in particular, electronic components there. In this case, the power E which is drawn from the supply signal S1 may normally be temporarily stored initially in an electrical energy store, for example in the form of a capacitor.

In, contrast to a first known system, in which the backward direction between the load 20 and the generator 30 is formed via an air gap whose impedance value is relatively undefined, the transmission path 40 in the system 100 has a second branch element 42. The latter contains the second transmission capacitance C3, which preferably has the same capacitance value as the first transmission capacitance C2. After passing through the load 20, the supply signal S1 is fed back in the second branch element 42 to the generator. The second transmitter capacitance C3 thus also ensures a well-defined impedance value for the transmission in the backward direction. A closed circuit is then formed, with defined impedance relationships. It is thus possible to operate at a comparatively low supply frequency in the range between 1 kHz and 1 MHz, and also with a low supply power level. This reduces the complexity required for implementation of the system 100.

In contrast to a further known system, which contains a transmission path in the form of a filter chain, the two branch elements 41 and 42 of the transmission path 40 in the system 100 are completely isolated from one another. This means that no electrically conductive connection exists between the two branch elements 41 and 42, except at the generator 30 and at the load 20. They are electrically isolated from one another in this area. In particular, and in contrast to the known filter chain, no parallel inductors are provided as connecting elements. It has been found that this considerably simpler design can be used by preference when the supply signal S1 is at a relatively low supply power level. The generator 30 can itself in this case provide the charging power for the transmission capacitances C2 and C3. Overall, the load 20 can be supplied by the system 100 in a particularly simple and low-cost manner with a power level of up to 100 mW. This is sufficient for operation of many of the electronic circuits that are used nowadays.

In order to avoid supply energy from flowing away undesirably, two or more blocking inductances L1 to L5 are provided and each have inductance values such that they have a very high impedance at the supply frequency and, in the ideal situation, represents an open circuit. The blocking inductances L1 and L3 prevent the supply signal S1 from flowing away to ground while, in contrast, the blocking inductances L4 and L5 prevent it flowing away via the high-voltage conductor 10. The blocking inductance L2 forces the supply signal S1 to flow to the load 20. For illustrative purposes, the signal path for the supply signal S1 is indicated by arrows with a solid line in FIG. 1.

If necessary, the blocking inductances L1 to L5 may also have surge arrestors and/or damping resistors added to them.

The blocking inductances L1 to L5 do not represent an open circuit, but virtually a short circuit, at the mains system frequency (=DC, 50 Hz or 60 Hz) for the high-voltage conductor 10. At the least, they assume a very low impedance value at this frequency. The two branch elements 41 and 42 are thus connected in parallel for the mains system frequency, and are not connected in series, as at the supply frequency. The transmission capacitances C2 and C3 which are connected in parallel at the mains system frequency may therefore also be used as a high-voltage capacitance for a capacitive voltage converter. A voltage measurement signal UM for the conductor-ground voltage of the high-voltage conductor 10 can then be tapped off from an additionally provided low-voltage capacitance C1. The system 100 carries out two functions. It is used for supplying power to the load 20 and for voltage measurement. One particularly simple and thus advantageous implementation of the system 100 is obtained by integration in a commercially available capacitive voltage converter. It is also advantageous with regard to costs for the transmission capacitances C2 and C3 to be standardized or series-production components, for example in the form of a wound capacitor bank.

Depending on the physical form of the transmission capacitances C2 and C3, they may also have a series inductance. This is the case, for example, with the wound capacitor bank that has been mentioned. It is then advantageous for the supply frequency (which in principle can be chosen freely in the rate between 1 kHz and 1 MHz) to in fact correspond to the series resonant frequency, which is formed by the series inductance and the capacitance value of the transmission capacitances C2 or C3. The two branch elements 41 and 42 then represent a particularly low impedance for the supply signal S1.

The voltage difference between the two branch elements 41 and 42 is only very small (for example several tens of volts), so that they can be isolated from one another without any problems. In particular, they can thus be located very closely adjacent to one another and, for example, can also be accommodated in a common isolator 80. This is a very cost-saving solution. The close physical system of the branch elements 41 and 42 also results in the radiated emissions of supply power, which have already been greatly reduced in any case by the low supply frequency, being virtually completely suppressed.

Figure 2:
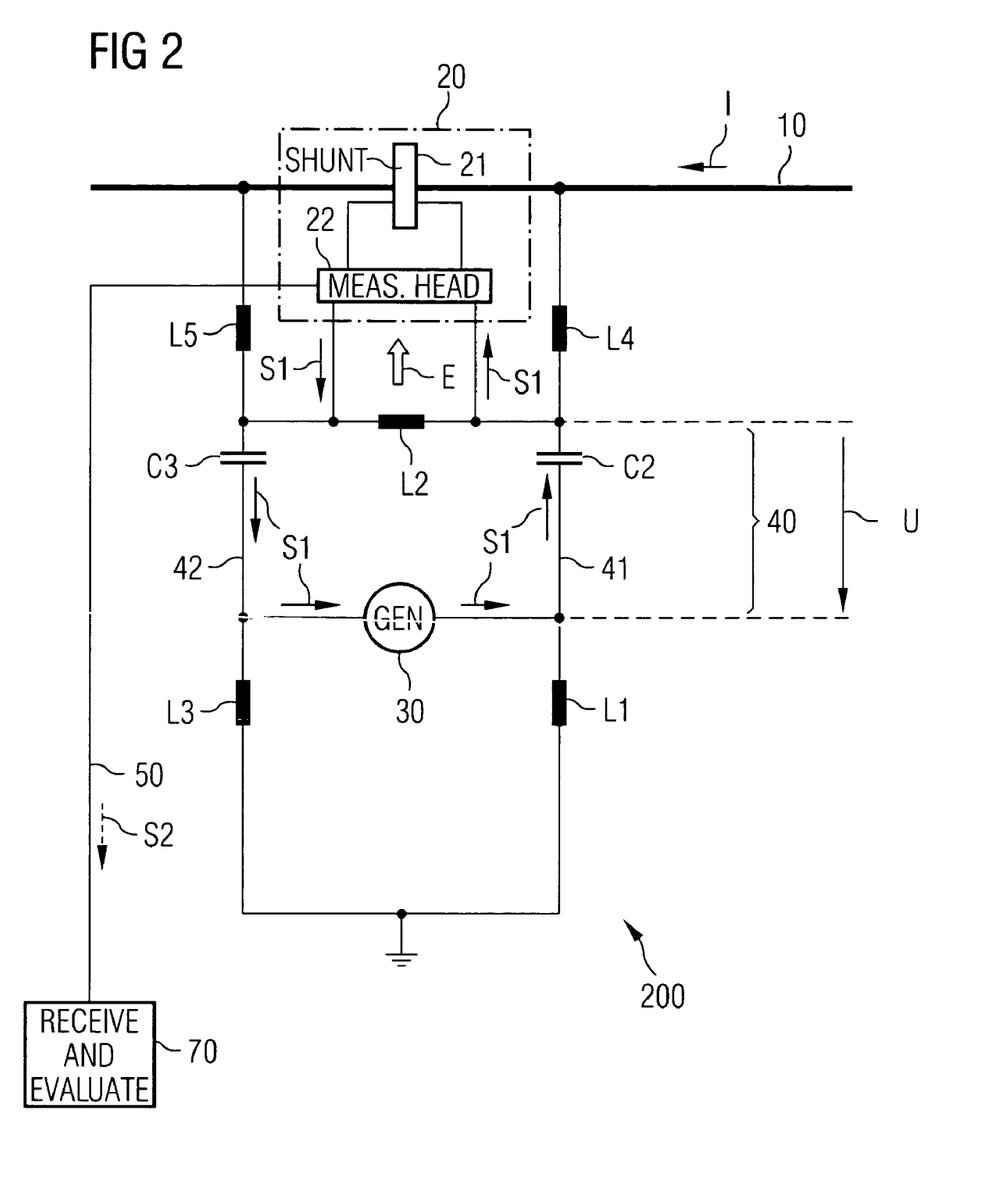
FIG. 2 shows a system for an isolated power supply for a test set, using optical measurement signal transmission.

FIG. 2 shows another system 200, which is likewise intended for an isolated power supply for a load 20. In the example in FIG. 2, the load 20 is in the form of a test set for detection of a current I flowing in the high-voltage conductor 10. The test set 20 contains a measurement shunt 21 and measurement head electronics 22, in which a measurement signal S2 for the current I is determined. The measurement signal S2 is transmitted optically to a receiving and evaluating unit 70, which is at ground potential. An optical transmission path 50, for example in the form of an optical waveguide connection, is provided for this purpose. The measurement head electronics 22 are supplied with power E via the supply signal S1 in the manner described in conjunction with FIG. 1. In the transmission path 50, the optical transmission results in isolation in a similar way to the transmission capacitances C2 and C3 in the transmission path 40, so that the system 200 is also an isolated system, overall, and is thus highly suitable for use for high-voltage purposes.

In another embodiment, which is not illustrated in FIG. 2, an optical transmission path which is likewise provided is not intended, as in the case of the example shown in FIG. 2, for transmission of a measurement signal from a high-voltage potential to ground potential, but for transmission of an optical energy signal in the opposite direction, that is to say from ground potential to a high-voltage potential. The optical power supply system is provided in addition to the transmission path 40, and is used in particular for redundancy or else as a secondary—likewise isolated—power supply when the load 20 demands a particularly high power level, for example during the switching-on process. At times when the power demand is lower, the additional optical power supply system can be switched to a standby mode, thus resulting in the components of the optical power supply system having a considerably longer life. The additional optical power supply path can be combined with all of the systems 100 to 400 illustrated in the FIGS. 1 to 4.

Figure 3:
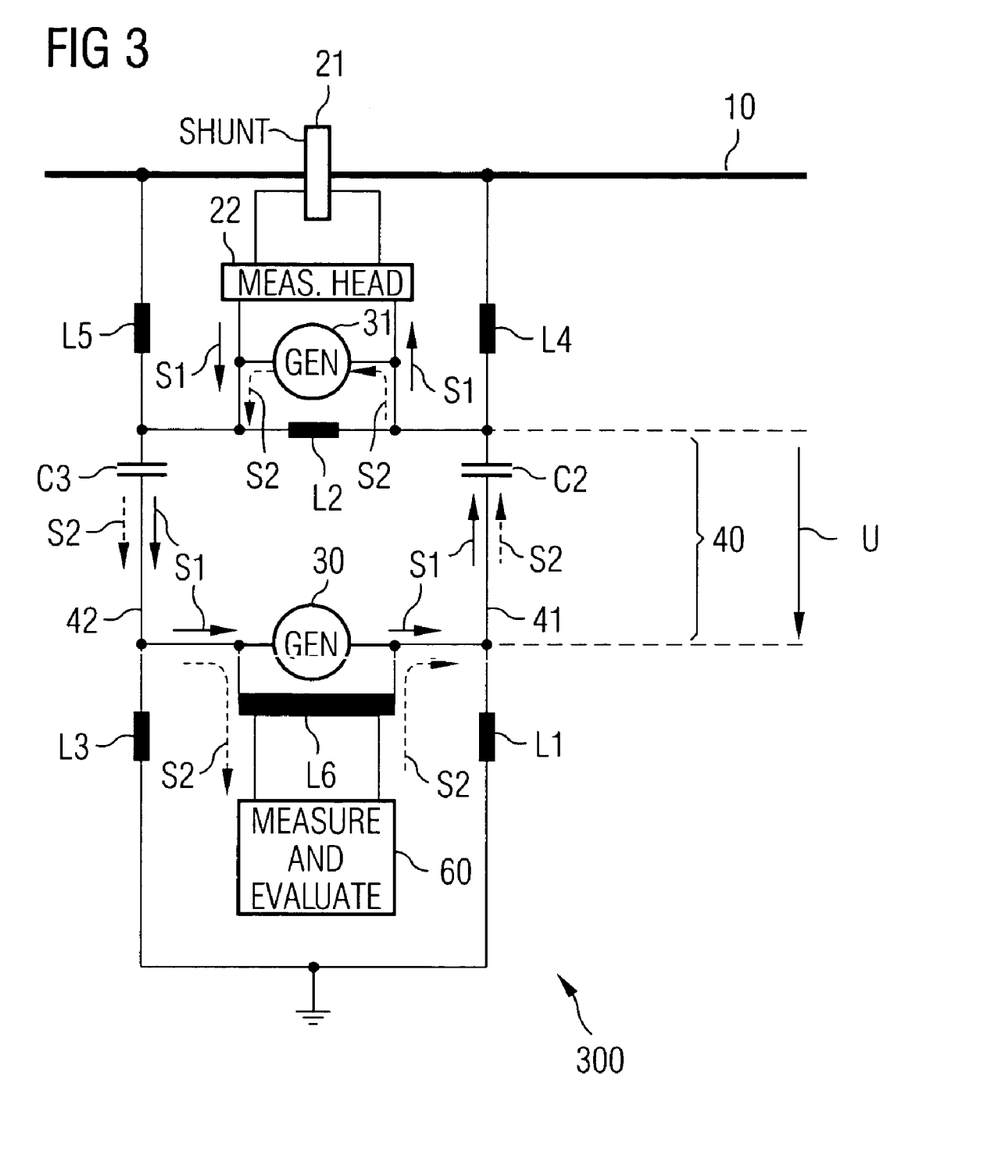
FIG. 3 shows a system for isolated power supply for a test set, using electrical measurement signal transmission.

In the case of a further system 300, which is illustrated in FIG. 3, the load 20 is in the form of an ammeter, to which power E is supplied in an isolated manner via the supply signal S1. In contrast to the system 200, the measurement signal S2 which is produced in the measurement head electronics 22 is not transmitted optically, but electrically via a transmission path 40 which is also used for the supply signal S1 and is thus available in any case.

The measurement signal S2 which includes the current information is produced as a high-frequency signal in a second generator 31 which is at the high-voltage potential and is a component of the ammeter, is fed into the transmission path 40, and is transmitted to a receiving and evaluation unit 60. The measurement signal S2 is at a measurement signal frequency from the same frequency range from which the supply frequency can also be chosen, that is to say between 1 kHz and 1 MHz. In order to avoid any mutual influence, the measurement frequency and the supply frequency do, however, have a different frequency value. In the example in FIG. 3, the supply frequency is 10 kHz and the measurement signal frequency is 100 kHz.

An additional blocking inductance L6 which is connected in parallel with the first generator 30 and the receiving and evaluation unit 60 has a comparable effect to the blocking inductance L2. This ensures that the measurement signal S1 is actually passed into the receiving and evaluation unit 60, so that it can be evaluated there. For illustrative purposes, FIG. 3 also shows the signal path of the measurement signal S2 by arrows with a dashed line.

The systems 200 and 300 may be combined with capacitive voltage measurement in a similar way to the system 100, so that, overall, this in each case results in a system for combined current and voltage measurement. Furthermore, the transmission paths 40 and 50 may also be arranged in an isolator 80, which is not illustrated in either of FIG. 2 or 3.

The systems 100, 200 and 300 are suitable for use at DC or at an AC mains system frequency on the high-voltage conductor 10.

Figure 4:
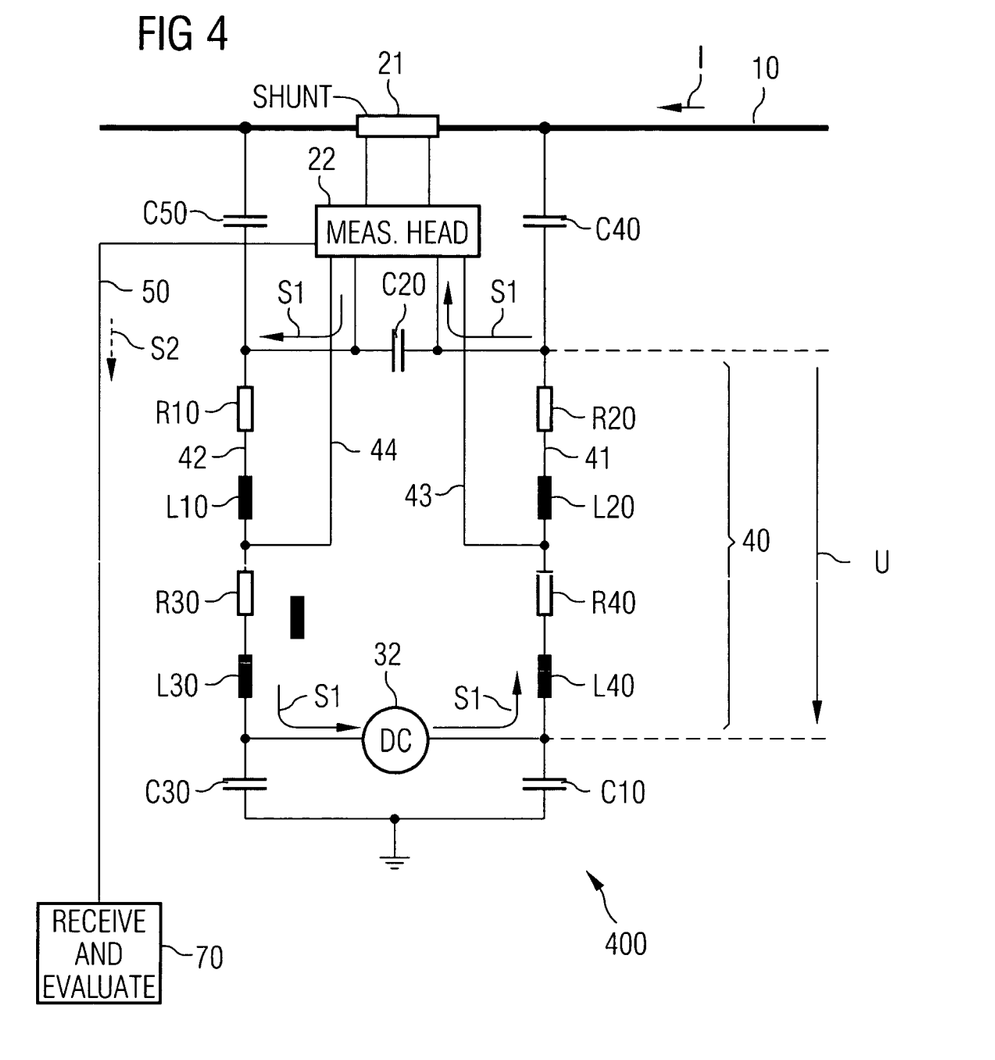
FIG. 4 shows a further system for an isolated power supply for a test set, using optical measurement signal transmission.

In the case of a further system, which is intended for an AC mains system frequency and is illustrated in FIG. 4, for an isolated power supply, the transmission capacitances C2 and C3 which are provided in the systems 100, 200 and 300 for absorption of the potential difference ΔU are essentially replaced by transmission inductances L20 and L40, as well as L10 and L30, respectively. The supply signal S1 in this example is a DC signal and is produced by a DC generator 32, which is effectively arranged at ground potential. The transmission inductances L10 to L40 represent a short circuit for the DC supply signal S1. Furthermore, their inductance values are such that they assume suitable impedance values for absorbing the high-voltage potential at the mains system frequency (=50 Hz or 60 Hz).

Analogously to the systems 100, 200 and 300, the system 400 also has a unit to prevent the supply energy from flowing away in an undesirable manner. However, since the supply signal S1 is in this case a DC signal, the unit to prevent the supply energy from flowing is not inductive, but capacitive, in the form of blocking capacitances C10 to C50, which each represent an open circuit for the DC supply signal S1 and low impedance at the mains system frequency, so that they have a comparable effect to the blocking inductances L1 to L5 in the systems 100, 200 and 300. Undesirable radiated emissions of supply power are totally avoided by the use of a DC signal as the supply signal S1.

In order to absorb the potential difference ΔU and in order to transmit the DC supply signal S1 as well, it would in principle be sufficient to provide in each case only one of the transmission inductances, that is to say for example L10 and L20, in the two branch elements 42 and 41, respectively. The two further transmission inductances L30 and L40 can likewise be additionally provided as series-connected transmission resistors R10 to R40, in order to make it possible to carry out a voltage measurement on the high-voltage conductor 10 as well, using the system 400. A resistive-inductive voltage divider is then formed in each of the two branch elements 41 and 42, in each of which a respective center tap 43 or 44 is connected to the measurement head electronics 22. The transmission resistors R10 to R40 are used firstly to damp any undesirable resonance which may occur, and secondly for frequency compensation when the measurement variable to be detected on the high-voltage conductor 10 is at a low frequency. However, if required, they may also be omitted.

Thus, in addition to the measurement information relating to the current I as determined by the measurement shunt 21, measurement information relating to the conductor-ground voltage of the high-voltage conductor 10 is also determined in the measurement head electronics 22. The optically transmitted measurement signal S2 contains information relating to both detected variables.

The invention has been described in detail with particular reference to preferred embodiments thereof and examples, but it will be understood that variations and modifications can be effected within the spirit scope of the invention.

The invention claimed is:

1. A system for isolated supply of electrical power to an electric load, comprising:
   a generator to produce a supply signal; and
   a transmission path which contains two separate branch elements, with
   the first branch element transmitting the supply signal in a direction from the generator to the load, and the second branch element transmitting the supply signal in a direction from the load to the generator, the two branch elements being each connected to the generator and to the load such that a closed circuit is formed for the supply signal, the two branch elements having an isolation unit to electrically isolate the branch elements from one another; and the load being supplied with an electrical power of at most 100 mW from the supply signal.

2. The system as claimed in claim 1, wherein the load and the generator are at different electrical potentials.

3. The system as claimed in claim 1, wherein the two branch elements are arranged closely adjacent to one another.

4. The system as claimed in claim 1, wherein the two branch elements are arranged alongside one another in an isolator.

5. The system as claimed in claim 1, wherein the transmission path has a voltage measurement unit to measure an electrical voltage difference between the load and ground.

6. The system as claimed in claim 1, wherein the isolation unit comprises at least one reactance provided in the branch elements.

7. The system as claimed in claim 1, wherein the isolation unit comprises at least one capacitor in each of the branch elements.

8. The system as claimed in claim 1, wherein the supply signal is at a supply frequency of between 1 kHz and 1 MHz.

9. The system as claimed in claim 1, wherein the supply signal is a DC signal.

10. The system as claimed in claim 1, wherein
the load is a test set,
the transmission path transmits a measurement signal, and
the measurement signal is measured by the test set.

11. The system as claimed in claim 10, wherein load is an ammeter.

12. The system as claimed in claim 1, wherein
the load is a test set,
an additional transmission path is provided to transmit a measurement signal, and
the measurement signal is measured by the test set.

13. The system as claimed in claim 12, wherein the load is an ammeter.

14. The system as claimed in claim 2, wherein the two branch elements are arranged alongside one another in an isolator.

15. The system as claimed in claim 5, wherein the transmission path has a voltage measurement unit to measure an electrical voltage difference between the load and ground.

16. The system as claimed in claim 15, wherein the isolation unit comprises at least one capacitor in each of the branch elements.

17. The system as claimed in claim 16, wherein the supply signal is at a supply frequency of between 1 kHz and 1 MHz.

18. The system as claimed in claim 17, wherein the supply signal is a DC signal.

19. The system as claimed in claim 14, wherein
the load is an ammeter,
the transmission path transmits a measurement signal, and
the measurement signal is measured by the ammeter.

20. The system as claimed in claim 14, wherein
the load is an ammeter,
an additional transmission path is provided to transmit a measurement signal, and
the measurement signal is measured by the ammeter.

21. A system for isolated supply of electrical power to a load, comprising:
a generator to produce a supply signal that has a power of 100 mW or less;
a transmission path having two separate branch elements, with the first branch element transmitting the supply signal in a direction from the generator to the load, and the second branch element transmitting the supply signal in a direction from the load to the generator, the two branch elements each being connected to the generator and to the load such that a closed circuit is formed for the supply signal; and
an isolation unit to isolate the branch circuits from one another.

* * * * *